(12) United States Patent
Shaak et al.

(10) Patent No.: US 7,764,473 B2
(45) Date of Patent: Jul. 27, 2010

(54) METHOD OF DETECTING A GROUND FAULT AND ELECTRICAL SWITCHING APPARATUS EMPLOYING THE SAME

(75) Inventors: Todd M. Shaak, Presto, PA (US); Harry J. Carlino, Export, PA (US)

(73) Assignee: Eaton Corporation, Cleveland, OH (US)

( * ) Notice: Subject to any disclaimer, the term of this patent is extended or adjusted under 35 U.S.C. 154(b) by 700 days.

(21) Appl. No.: 11/746,098

(22) Filed: May 9, 2007

(65) Prior Publication Data

US 2008/0278871 A1 Nov. 13, 2008

(51) Int. Cl.
*H02H 3/00* (2006.01)

(52) U.S. Cl. .............................. 361/42; 361/43; 361/44; 361/45; 361/46; 361/47; 361/48; 361/49; 361/50

(58) Field of Classification Search ............. 361/42–50, 361/78, 87, 93.1, 93.2, 93.5, 93.6, 102, 115; 324/509

See application file for complete search history.

(56) References Cited

U.S. PATENT DOCUMENTS

| | | | |
|---|---|---|---|
| 4,899,246 A * | 2/1990 | Tripodi | 361/44 |
| 5,260,676 A | 11/1993 | Patel et al. | |
| 5,293,522 A | 3/1994 | Fello et al. | |
| 5,436,785 A * | 7/1995 | Ferrazzi et al. | 361/42 |
| 5,910,760 A | 6/1999 | Malingowski et al. | |
| 5,940,257 A * | 8/1999 | Zavis | 361/42 |
| 6,137,386 A | 10/2000 | Mueller | |
| 6,144,271 A | 11/2000 | Mueller et al. | |
| 6,853,279 B1 | 2/2005 | Puskar et al. | |

\* cited by examiner

*Primary Examiner*—Jared J Fureman
*Assistant Examiner*—Terrence R Willoughby
(74) *Attorney, Agent, or Firm*—Martin J. Moran

(57) ABSTRACT

A circuit breaker includes for each neutral and phase power conductor, a current sensor sensing an alternating current flowing in a corresponding power conductor, a comparator determining whether the sensed alternating current is positive or negative, a rectifier rectifying the sensed alternating current to provide a rectified current value, and an analog-to-digital converter converting the rectified current value to a signed digital value having a positive sign. A processor cooperates with the comparators and the analog-to-digital converters and includes a routine that changes the positive sign of the signed digital value to a negative sign if the sensed alternating current is negative, adds the signed digital value for each power conductor to provide a sum, and employs the sum to determine whether to output a ground fault signal. The processor further cooperates with an operating mechanism to trip open separable contacts responsive to the ground fault signal.

22 Claims, 2 Drawing Sheets

METHOD OF DETECTING A GROUND FAULT AND ELECTRICAL SWITCHING APPARATUS EMPLOYING THE SAME

BACKGROUND OF THE INVENTION

1. Field of the Invention

This invention pertains generally to electrical switching apparatus and, more particularly, to ground fault circuit breakers. The invention also relates to methods of detecting a ground fault.

2. Background Information

Circuit breakers are used to protect electrical circuitry from damage due to an overcurrent condition, such as an overload condition or a relatively high level short circuit or fault condition. For example, in response to the overcurrent condition, a spring powered operating mechanism is unlatched, in order to open the separable contacts of the circuit breaker and, thus, interrupt current flow in a protected power system. Examples of circuit breakers are disclosed in U.S. Pat. Nos. 5,910,760; 6,137,386; 6,144,271; and 6,853,279, which are incorporated by reference herein.

In many applications, the circuit breaker also provides ground fault protection. Typically, an electronic circuit detects leakage of current to ground and generates a ground fault trip signal. For example, this trip signal energizes a shunt trip solenoid, which unlatches the operating mechanism to trip open the separable contacts.

A common type of ground fault detection circuit is the dormant oscillator detector including first and second sensor coils. The line and neutral conductors of the protected circuit pass through the first sensor coil. The output of this coil is applied through a coupling capacitor to an operational amplifier followed by a window comparator having two reference values. A line-to-ground fault causes the magnitude of the amplified signal to exceed the magnitude of the reference values and, thus, generates a trip signal. At least the neutral conductor of the protected circuit passes through the second sensor coil. A neutral-to-ground fault couples the two detector coils which causes the amplifier to oscillate, thereby resulting in the generation of the trip signal. See, for example, U.S. Pat. Nos. 5,260,676; and 5,293,522.

Ground fault current is conventionally sensed or measured with some sort of summing current transformer. For a three-conductor (e.g., phases A, B and C) or four-conductor (e.g., neutral plus phases A, B and C) power circuit, for example, this current transformer sums the three or four conductor currents and provides an output that corresponds to the amount of imbalance between the conductor currents.

On some known plural-pole circuit breakers, the ground current is sensed either internally via a secondary current transformer (e.g., mounted on a printed circuit board to sum the secondary currents out of the various phase current transformers) or externally via a primary current transformer (e.g., a source ground current transformer, which sums the primary current). In either example, the output of the current transformer, which should normally be zero, represents any ground fault current.

There is room for improvement in electrical switching apparatus that provide ground fault detection.

There is also room for improvement in methods of detecting a ground fault.

SUMMARY OF THE INVENTION

These needs and others are met by embodiments of the invention, which eliminate the need for any type of summing current transformer, thereby reducing the cost and complexity of the electrical switching apparatus, such as a circuit breaker.

In accordance with one aspect of the invention, a method of detecting a ground fault of an alternating current power circuit including a plurality of power conductors comprises: for each of the power conductors, sensing an alternating current flowing in a corresponding one of the power conductors, determining whether the sensed alternating current is positive or negative, rectifying the sensed alternating current to provide a rectified current value, converting the rectified current value to a signed digital value having a positive sign, and changing the positive sign of the signed digital value to a negative sign if the sensed alternating current is negative; adding the signed digital value for each corresponding one of the power conductors to provide a sum; and employing the sum to determine whether to output a ground fault signal.

As another aspect of the invention, an electrical switching apparatus comprises: a plurality of power conductors; a number of pairs of separable contacts, each pair of the number of pairs being electrically connected in series with a corresponding one of the power conductors; an operating mechanism structured to open and close the number of pairs of separable contacts; for each of the power conductors, a current sensor structured to sense an alternating current flowing in a corresponding one of the power conductors, a comparator structured to determine whether the sensed alternating current is positive or negative, a rectifier structured to rectify the sensed alternating current to provide a rectified current value, and an analog-to-digital converter structured to convert the rectified current value to a signed digital value having a positive sign; and a processor cooperating with the comparator and the analog-to-digital converter for each of the power conductors, the processor comprising a routine structured to change the positive sign of the signed digital value to a negative sign if the sensed alternating current is negative, add the signed digital value for each of the power conductors to provide a sum, and employ the sum to determine whether to output a ground fault signal, the processor further cooperating with the operating mechanism to trip open the number of pairs of separable contacts responsive to the ground fault signal.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The invention is described in association with a three-pole circuit breaker including three phase conductors and one neutral conductor, although the invention is applicable to a wide range of electrical switching apparatus having a plurality of power conductors. As some non-limiting examples, there could be a neutral power conductor and any suitable number of phase power conductors. Alternatively, there could be a two-power conductor system, which is a single phase system (e.g., without limitation, line and neutral). In the absence of a ground fault, the current flowing through the circuit breaker in one power conductor (e.g., without limitation, line) must normally equal the current flowing back through the other power conductor (e.g., without limitation, neutral) of the circuit breaker. As another alternative, there could be a three-phase system without a neutral, or there could be a four-power conductor system where there are three phase power conductors and one neutral power conductor. The neutral power conductor may or may not be switched.

As employed herein, the term "number" shall mean one or an integer greater than one (i.e., a plurality).

Figure 1:
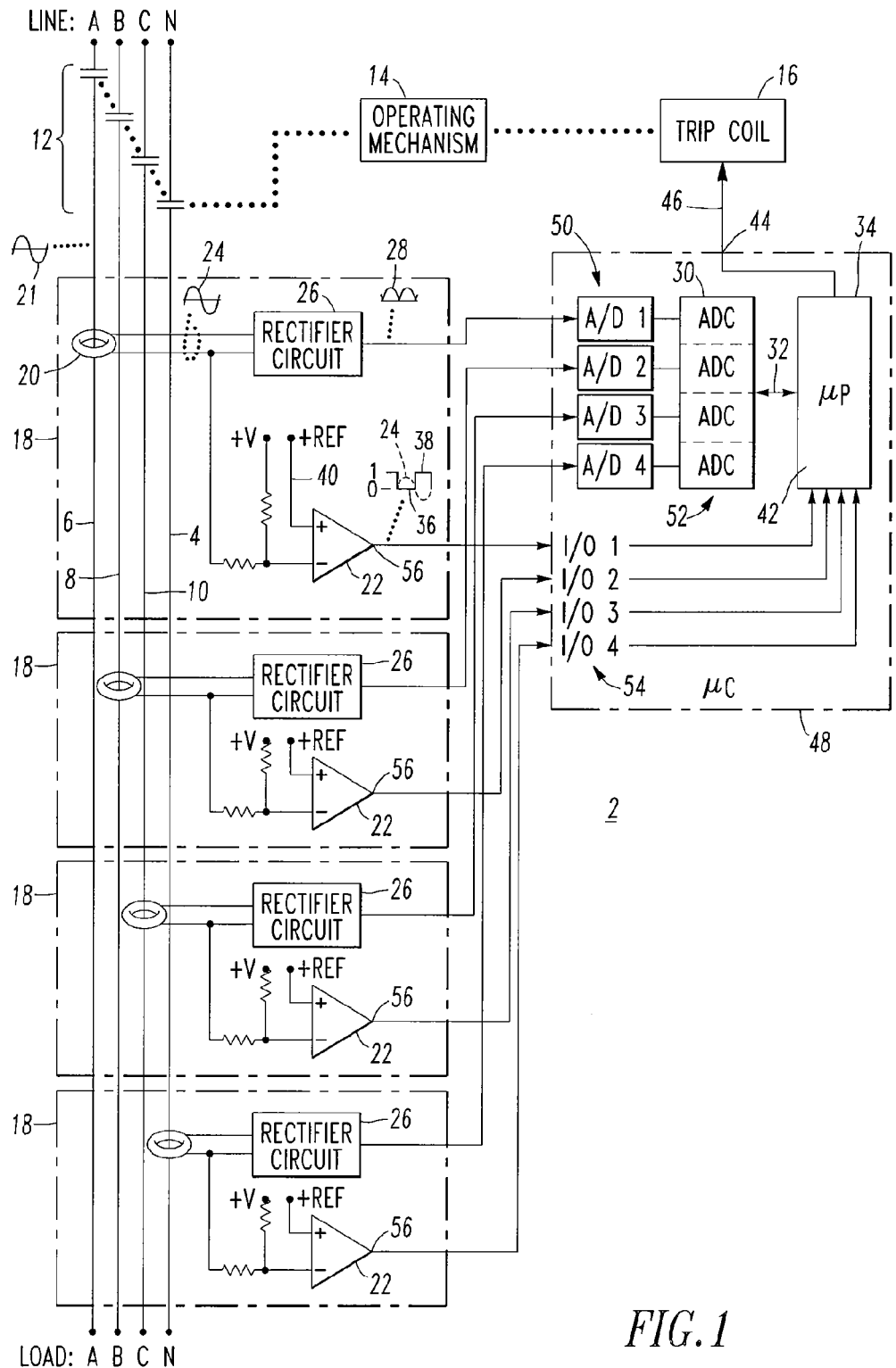
FIG. 1 is a block diagram of a circuit breaker including a microprocessor in accordance with embodiments of the invention.

Referring to FIG. 1, an electrical switching apparatus, such as a circuit breaker 2, includes a neutral power conductor (N) 4, a number of phase power conductors (e.g., three phase power conductors (A, B and C) 6,8,10 are shown), and a number of pairs of separable contacts (e.g., four separable contacts 12 are shown, although the invention is applicable to electrical switching apparatus in which the neutral power conductor (N) 4 is not switched). Each pair of the example separable contacts 12 is electrically connected in series with a corresponding one of the power conductors 4,6,8,10. As is conventional, a suitable operating mechanism 14 is structured to open and close the separable contacts 12 responsive, for example, to a trip coil 16 being energized through a suitable buffer or interface (not shown).

In accordance with an important aspect of the invention, for each of the example power conductors 4,6,8,10, a circuit 18 is provided as will be described. As shown, for example, with the A phase power conductor 6, the circuit 18 includes a current sensor, such as current transformer (CT) 20, structured to sense an alternating current 21 flowing in the corresponding power conductor (e.g., A phase power conductor 6), a comparator 22 determining whether sensed alternating current 24 output from the CT 20 is positive or negative, a rectifier circuit 26 (e.g., without limitation, a full-wave bridge rectifier) rectifying the sensed alternating current 24 to provide a rectified current value 28, and an analog-to-digital converter (ADC) 30 converting the rectified current value 28 to a signed digital value 32 having a positive sign. A processor, such as a microprocessor (μP) 34, cooperates with the comparator 22 and the ADC 30 for each of the power conductors 4,6,8,10. The comparator 22 determines whether the sensed alternating current 24 is positive 36 or negative 38 by comparing the sensed alternating current 24 to a suitable predetermined reference value 40 (e.g., without limitation 2.5 VDC). The output 56 of the comparator 22 is a digital signal that is either low or high. For example, if the half cycle of the alternating current 24 is positive, then this digital signal will be low. Otherwise, if the half cycle of the alternating current is negative, then the digital signal will be high. Alternatively, the invention is applicable to the digital signal being high for the alternating current 24 being positive, and the digital signal being low for the alternating current being negative.

As will be discussed in greater detail, below, in connection with FIG. 2, the μP 34 includes a routine 42 structured to change the positive sign of the signed digital value 32 to a negative sign if the sensed alternating current 24 is negative as determined by the comparator 22, add the signed digital values corresponding to all of the power conductors 4,6,8,10 to provide a sum, and employ the sum to determine whether to responsively output, at microcomputer (μC) output 44, a ground fault trip signal 46, which energizes the trip coil 16. In this manner, the μP 34 cooperates with the operating mechanism 14 to trip open the separable contacts 12 responsive to the ground fault trip signal 46.

As shown in FIG. 1, the three-phase currents (e.g., alternating current 21 of phase A power conductor 6) and neutral current flow through the four power conductors 4,6,8,10 of the circuit breaker 2. Although four power conductors 4,6,8, 10 are shown, the invention is applicable to electrical switching apparatus having a plurality of power conductors (e.g., without limitation, line and neutral; phases A, B and C with or without neutral). For each of the four example power conductors 4,6,8,10, the alternating current, such as 21, is sensed as primary current by the CT 20. The secondary current 24 from the CT 20 is passed through the rectifier circuit 26. The rectified current value 28 from the rectifier circuit 26 is full-wave rectified, as shown. This rectified current value 28 is used both to provide current to a power supply (not shown) for microcomputer (μC) 48 and for current measurement by the μP 34 (e.g., without limitation, for a number of protection routines including, but not limited to, the ground fault routine 42). For example, the current measurement is accomplished by applying the sensed alternating current 24 through a precision burden resistor (not shown) of the rectifier circuit 26. This burden resistor translates the secondary current to a corresponding voltage that is applied to the corresponding ADC channel 50. The corresponding current in any of the power conductors 4,6,8,10 is then sampled by a suitable circuit, such as the corresponding channel 50 of an example four-channel ADC 52 of the μC 48. The μC 48 includes a plurality of digital inputs and outputs, such as the output 44 for the ground fault trip signal 46 and a plurality of inputs 54 for the outputs 56 of the comparators 22.

Figure 2:
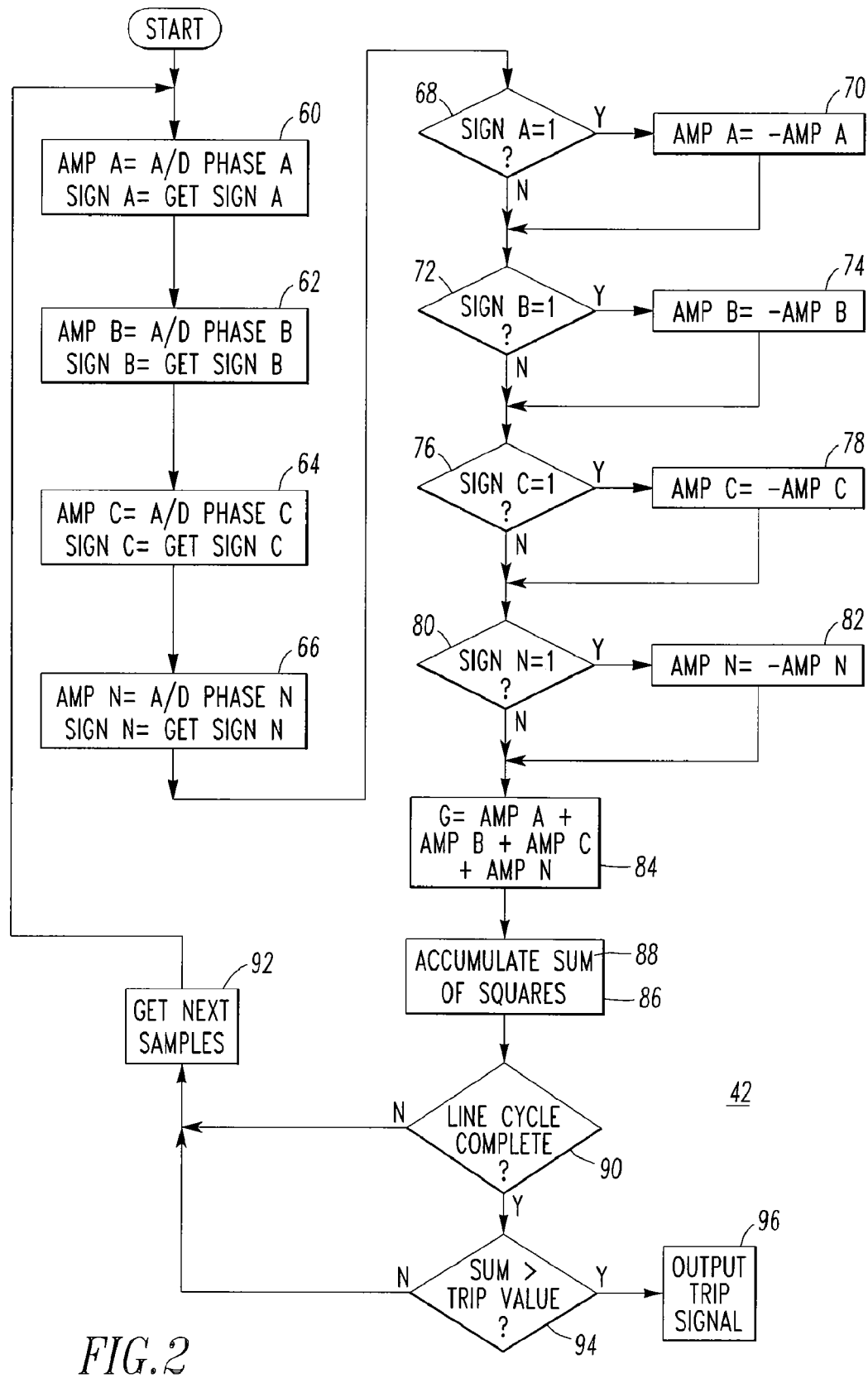
FIG. 2 is a flowchart of firmware executed by the microprocessor of FIG. 1.

Referring to FIG. 2, the μP routine 42 is shown. First, at 60, the μP 34 of FIG. 1 reads the digital amplitude of the rectified current value 28 from the corresponding channel 50 of the ADC 52 and the sign 36 or 38 of the sensed alternating current 24 from the corresponding comparator 22 for the phase A power conductor 6. Steps 62, 64 and 66 provide corresponding functions for the phase B power conductor 8, phase C power conductor 10 and neutral power conductor 4, respectively.

Next, at 68, it is determined if the sign 36 or 38, as read at 60, of the sensed alternating current 24 from the comparator 22 for the phase A power conductor 6 is logic one, which corresponds to a negative alternating current value. In contrast, a logic zero corresponds to a positive alternating current value. If so, then at 70, the positive sign of the digital amplitude of the rectified current value 28 for the phase A power conductor 6, as read at 60, is changed to a negative sign. Otherwise, after either 68 or 70, execution resumes at 72.

Steps 72 and 74, 76 and 78, and 80 and 82 provide corresponding functions for the phase B power conductor 8, phase C power conductor 10 and neutral power conductor 4, respectively.

After either 80 or 82, at 84, the signed digital values as read at 60,62,64,66, or as modified at 70,72,74,76, are added to provide a sum (G). Next, at 86, a sum 88 of the squares of the sum (G) is accumulated. As a non-limiting example, the individual samples of ground current (G) are squared and added together to provide an overall sum of squares per line cycle. For example, one cycle of line current at 60 Hz lasts for about 16.666 mS. There are 15 samples of line and ground current taken during one line cycle of current (e.g., 15 samples at 1.11 mS intervals). The individual samples are squared and summed to get an RMS value of current over the entire cycle. This sum is employed, at 94, to determine if there is a ground fault condition or not.

After 86, at 90, it is determined if a line cycle is complete. As a non-limiting example, this is determined after 15 samples of line and ground current have been sampled and accumulated through 15 iterations of even steps 60-86. If not, then at 92, the next set of samples is obtained beginning at 60. Otherwise, at 94, it is determined if the sum 88 of step 86 exceeds a predetermined trip value. If so, then, at 96, the μP 34 sets the ground fault trip signal 46 at the μC output 44, which energizes the trip coil 16 and, thus, trips open the separable contacts 12 for the power conductors 4,6,8,10 responsive to the ground fault trip signal 46. On the other hand, if the sum 88 of step 86 does not exceed the predetermined trip value, then execution resumes at 92 for the next line cycle.

Continuing to refer to FIGS. 1 and 2, if the instantaneous currents, such as alternating current 21, in the four power conductors 4,6,8,10 do not instantaneously add up to zero, then there is current flowing to ground. In other words, if there is an imbalance in the four power conductor currents, such as 21, then there exists a corresponding ground fault current. In order to sense an imbalance in these power conductor currents, there is the need to sum the four power conductor currents in alternating current (AC) form. However, after the sensed alternating current 24 of FIG. 1 passes through the corresponding rectifier circuit 26, the corresponding instantaneous sign information (positive or negative) is lost. The disclosed circuit 18 of FIG. 1 and the μC 48 retain or preserve this sign information (positive 36 or negative 38) of an individual power conductor current, such as 21, for later use. The circuit 18 senses the sign of the AC current 21 and provides either a digital low, at 36, or digital high, at 38, output 56 from the comparator 22 depending on the sign of the secondary sensed alternating current 24. By knowing the magnitude of the four power conductor currents from the corresponding ADCs 30 and the respective signs from this circuit 18, any imbalance/ground fault current (G) is reconstructed in the μP 34 at 84 of FIG. 2.

Example 1

For a single power line plus neutral power line circuit breaker application, steps 62,64,72,74,76,78 are not performed, and the sum, at 84, is just for the signed digital values as read at 60,66, or as modified at 70,82.

Example 2

As an alternative to Example 1, the number of phase power conductors may be two or more phase power conductors.

Example 3

The circuit breaker 2 of FIG. 1 includes a frame rating, and the predetermined value of step 94 is a predetermined percentage of the frame rating.

Example 4

As non-limiting examples, the predetermined trip value may be any suitable trip threshold. For example, the predetermined percentage of Example 3 is selected from the group consisting of 20%, 40%, 60%, 80% and 100% of the circuit breaker frame rating.

Example 5

As a non-limiting example, the frame rating of the circuit breaker 2 is about 400 A.

Example 6

As shown with the phase A power conductor 6, the alternating current 21 includes a plurality of zero crossings for the power conductor 6. The signed digital value 32 directly corresponds to an instantaneous value of the rectified current value 28. The μP routine 42 is preferably structured to repetitively repeat execution (from step 90 or 94 to step 92) without regard to timing of the zero crossings. As a non-limiting example, 15 sets of samples are taken every line cycle (e.g., without limitation, about every 1.11 mS for a 60 Hz power line). In other words, execution of the routine 42 and reading of the values at steps 60,62,64,66, may be asynchronous to the AC waveforms of the power conductor currents, such as 21. Hence, in this example, the sensed alternating current 24 (and the corresponding signed digital value 32) are instantaneous values of the alternating current 21 flowing in the corresponding one of the power conductors 4,6,8,10.

Example 7

Alternatively, or in addition to steps 86, 90, 92, 94 and 96, the sum (G) is employed to determine if the ground current is over a suitable predetermined level for short delay and/or instantaneous.

Example 8

Alternatively, or in addition to steps 86, 90, 92, 94 and 96, for long delay, there is a sum that includes, for example, 240 squared samples instead of the previously discussed sum of 15 squared samples.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A method of detecting a ground fault of an alternating current power circuit including a plurality of power conductors, said method comprising:
   for each of said power conductors,
      sensing an alternating current flowing in a corresponding one of said power conductors,
      determining whether said sensed alternating current is positive or negative,
      rectifying said sensed alternating current to provide a rectified current value,
      converting said rectified current value to a signed digital value having a positive sign, and
      changing the positive sign of said signed digital value to a negative sign if said sensed alternating current is negative;
   adding the signed digital value for each corresponding one of said power conductors to provide a sum; and
   employing said sum to determine whether to output a ground fault signal.

2. The method of claim 1 further comprising
tripping open separable contacts for at least some of said power conductors responsive to said ground fault signal.

3. The method of claim 1 further comprising
sensing said alternating current with a current transformer.

4. The method of claim 1 further comprising
determining whether said sensed alternating current is positive or negative with a comparator having a predetermined reference value.

5. The method of claim 1 further comprising
rectifying said sensed alternating current with a full-wave bridge rectifier.

6. The method of claim 1 further comprising
converting said rectified current value with an analog-to-digital converter.

7. The method of claim 1 further comprising
reading the signed digital value having the positive sign from an analog to digital converter with a processor; and
reading said positive or negative from a comparator with said processor.

8. The method of claim 7 further comprising
changing the positive sign of said signed digital value to the negative sign with said processor.

9. The method of claim 8 further comprising
adding the signed digital value for each corresponding one of said power conductors with said processor; and
determining whether to output the ground fault signal with said processor.

10. The method of claim 1 further comprising
employing said alternating current power circuit including a plurality of zero crossings of the alternating current for said power conductors; and
repetitively repeating, without regard to timing of said zero crossings, said for each of said power conductors, said adding the signed digital value for each corresponding one of said power conductors, and said employing said sum to determine whether to output the ground fault signal.

11. The method of claim 1 wherein said sensed alternating current is a sensed instantaneous value of the alternating current flowing in the corresponding one of said power conductors.

12. The method of claim 1 further comprising
including with said alternating current a plurality of line cycles;
employing said sum as a first sum;
determining the signed digital value for each of said power conductors for a plurality of samples for each of said line cycles;
determining a second sum of the squares of said first sum for the samples for each of said line cycles; and
determining if said second sum exceeds a predetermined value and responsively outputting said ground fault signal.

13. An electrical switching apparatus comprising:
a plurality of power conductors;
a number of pairs of separable contacts, each pair of said number of pairs being electrically connected in series with a corresponding one of said power conductors;
an operating mechanism structured to open and close said number of pairs of separable contacts;
for each of said power conductors,
a current sensor structured to sense an alternating current flowing in a corresponding one of said power conductors,
a comparator structured to determine whether said sensed alternating current is positive or negative,
a rectifier structured to rectify said sensed alternating current to provide a rectified current value, and
an analog-to-digital converter structured to convert said rectified current value to a signed digital value having a positive sign; and
a processor cooperating with the comparator and the analog-to-digital converter for each of said power conductors, said processor comprising a routine structured to change the positive sign of said signed digital value to a negative sign if said sensed alternating current is negative, add the signed digital value for each of said power conductors to provide a sum, and employ said sum to determine whether to output a ground fault signal, said processor further cooperating with said operating mechanism to trip open said number of pairs of separable contacts responsive to said ground fault signal.

14. The electrical switching apparatus of claim 13 wherein said power conductors comprise a single line power conductor and a single neutral power conductor.

15. The electrical switching apparatus of claim 13 wherein said power conductors comprise a plurality of phase power conductors.

16. The electrical switching apparatus of claim 15 wherein said phase power conductors are three phase power conductors.

17. The electrical switching apparatus of claim 13 wherein said alternating current includes a plurality of line cycles; wherein said sum is a first sum; and wherein the routine of said processor is further structured to determine the signed digital value for each of said power conductors for a plurality of samples for each of said line cycles, determine a second sum of the squares of said first sum for the samples for each of said line cycles, and determine if said second sum exceeds a predetermined value and responsively output said ground fault signal.

18. The electrical switching apparatus of claim 17 wherein said electrical switching apparatus includes a frame rating; and wherein said predetermined value is a predetermined percentage of said frame rating.

19. The electrical switching apparatus of claim 18 wherein said predetermined percentage is selected from the group consisting of 20%, 40%, 60%, 80% and 100%.

20. The electrical switching apparatus of claim 18 wherein said frame rating is about 400 A.

21. The electrical switching apparatus of claim 13 wherein said electrical switching apparatus is a circuit breaker.

22. The electrical switching apparatus of claim 13 wherein said alternating current includes a plurality of zero crossings for said plurality of power conductors; wherein said signed digital value directly corresponds to an instantaneous value of said rectified current value; and wherein the routine of said processor is further structured to repetitively repeat execution without regard to timing of said zero crossings.

* * * * *